(12) United States Patent
Joo et al.

(10) Patent No.: US 8,012,829 B2
(45) Date of Patent: Sep. 6, 2011

(54) SEMICONDUCTOR DEVICE AND METHOD OF MANUFACTURING THE SAME

(75) Inventors: Kyung Joong Joo, Suwon-si (KR); Han Soo Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/923,497

(22) Filed: Sep. 24, 2010

(65) Prior Publication Data

US 2011/0014758 A1 Jan. 20, 2011

Related U.S. Application Data

(60) Division of application No. 11/798,947, filed on May 18, 2007, now Pat. No. 7,825,461, which is a continuation-in-part of application No. 11/657,650, filed on Jan. 25, 2007, now Pat. No. 7,626,230.

(30) Foreign Application Priority Data

May 18, 2006 (KR) .................. 10-2006-0044832

(51) Int. Cl.
*H01L 21/336* (2006.01)
(52) U.S. Cl. ........ 438/259; 438/262; 438/296; 257/331; 257/334; 257/510; 257/E29.26; 257/E21.422
(58) Field of Classification Search .................. 438/259, 438/262, 296; 257/331, 334, 510, E29.26, 257/E21.422
See application file for complete search history.

(56) References Cited

U.S. PATENT DOCUMENTS

| 6,048,765 | A | 4/2000 | Wu |
| 6,373,097 | B1 | 4/2002 | Werner |
| 6,437,397 | B1 | 8/2002 | Lin et al. |
| 6,583,479 | B1 | 6/2003 | Fastow et al. |
| 6,700,154 | B1 | 3/2004 | Vidmantas et al. |
| 6,825,526 | B1 | 11/2004 | He et al. |
| 6,844,591 | B1 | 1/2005 | Tran |
| 2002/0055230 | A1 | 5/2002 | Chang |
| 2002/0151136 | A1* | 10/2002 | Lin et al. ............... 438/259 |
| 2003/0047755 | A1 | 3/2003 | Lee et al. |
| 2005/0040475 | A1* | 2/2005 | Jang et al. ............... 257/396 |
| 2005/0054163 | A1 | 3/2005 | Kim et al. |
| 2006/0180851 | A1 | 8/2006 | Lee et al. |
| 2006/0258090 | A1 | 11/2006 | Bhattacharyya et al. |

FOREIGN PATENT DOCUMENTS

| JP | 07-288324 | 10/1995 |
| KR | 10-2001-0046068 | 6/2001 |
| KR | 10-2005-0026319 | 3/2005 |
| KR | 10-2005-0043424 | 5/2005 |
| KR | 10-2006-0042460 | 5/2006 |

* cited by examiner

*Primary Examiner* — Tu-Tu V Ho
(74) *Attorney, Agent, or Firm* — Harness, Dickey & Pierce, P.L.C.

(57) ABSTRACT

Example embodiments are directed to a method of manufacturing a semiconductor device and a semiconductor device including a substrate including a plurality of active regions and a plurality of isolation regions between adjacent active regions, each active region including a groove, a bottom surface of the groove being below an upper surface of the active region.

23 Claims, 21 Drawing Sheets

SEMICONDUCTOR DEVICE AND METHOD OF MANUFACTURING THE SAME

CROSS-REFERENCE TO RELATED APPLICATIONS

This application is a divisional under 35 U.S.C. §121 of U.S. application Ser. No. 11/798,947, filed May 18, 2007, U.S. Pat. No. 7,825,461, which is a continuation-in-part under 35 U.S.C. §120 of U.S. application Ser. No. 11/657,650, filed Jan. 25, 2007, now U.S. Pat. No. 7,626,230, which claims priority under 35 U.S.C. §119 to Korean Patent Application No. 10-2006-0044832 filed on May 18, 2006, the entire contents of each of which are herein incorporated by reference.

BACKGROUND

1. Field

Example embodiments relate to a storage device, for example, to a device and a method for manufacturing a non-volatile and electrically erasable semiconductor memory device, for example, a flash memory.

2. Description of the Related Art

Non-volatile memory retains information stored in its memory cells even when no power is supplied. Examples include mask ROM, EPROM, and EEPROM.

Non-volatile memory is widely used in various kind of electronic products, for example, personal computers, personal digital assistants (PDAs), cellular phones, digital still cameras, digital video cameras, video game players, memory cards, and other electronic devices.

Memory cards types may include multimedia cards (MMC), secure digital (SD) cards, compact flash cards, memory sticks, smart media cards, and extreme digital (xD) picture cards.

Among non-volatile memory devices, a flash memory is widely used. Flash memory may be divided into a Not-OR (NOR) type and a Not-AND (NAND) type based on a connection structure of cells and bit lines. Because a read speed is faster and a write operation is slower, a NOR-type flash memory may be used as a code memory. Because a write speed is faster and a price per unit area is lower, a NAND-type flash memory may be used as a mass storage device.

NOR-type flash memory may be used in BIOS/networking in a PC, a router, or a hub or in a telecommunications switcher. NOR-type flash memory may also be used to store code or data for cellular phones, personal digital assistants (PDAs), POS, or PCA.

NAND-type flash memory may be used in memory cards for mobile computers, digital cameras, both still and moving, near-CD quality voice and audio recorders, rugged and reliable storage, for example, solid-state disks.

The programming method for NOR-type flash memory is hot carrier injection and the programming method for NAND-type flash memory is Fowler-Nordheim (FN) tunneling.

Advances in consumer electronics cause demand for higher density memory devices. Efforts to manufacture devices meeting this demand often involve scaling down the sizes of gate structures and reducing or minimizing the space between adjacent gate structures.

With the reduction in channel length of transistors, the influence of a source and drain upon an electric field or potential in the channel region may increase. This is referred to as the 'short channel effect'. Other related problems include punch-through, and drain induced barrier lowering (DIBL).

Also, as channel width decreases with scaling down of the active size of a transistor, a threshold voltage may be increased. This is referred to as the 'narrow width effect'. Other related problems include reduced drain current.

The reduction of cell current may have a negative effect on endurance of the cell. Repetitive programming and erasing the cell may increase the number of electrons captured by a tunneling oxide layer. As the number of electron captured by tunneling oxide layer is increased, the threshold voltage may be increased and the cell current may be decreased.

SUMMARY

Example embodiments improve or maximize device performance. Example embodiments may overcome the 'short channel effect' and/or the 'narrow width effect'. Example embodiments may reduce cell current.

Example embodiments are directed to a semiconductor device including a substrate including a plurality of active regions and a plurality of isolation regions between adjacent active regions, each active region including a groove, a bottom surface of the groove being below an upper surface of the active region and a gate structure formed in the plurality of grooves, wherein the plurality of grooves are perpendicular to the gate structure.

In example embodiments, the plurality of grooves extend along a source, a channel, and a drain.

In example embodiments, the gate structure includes a floating gate structure.

In example embodiments, the floating gate structure may include a tunneling insulation layer in each of the plurality of grooves, a floating gate on the tunneling insulation layer in each of the plurality of grooves, a blocking insulation layer on the floating gate, and a control gate on the blocking insulation layer.

In example embodiments, the floating gate structure further including a spacer and a pad oxide between each active region and each isolation region.

In example embodiments, the control gate is a multilayer.

In example embodiments, the control gate is a poly or poly to metal layer.

In example embodiments, the spacer and the pad oxide are made of silicon oxide.

In example embodiments, the tunneling insulation layer is made of a material selected from the group consisting of silicon oxide, silicon nitride, aluminum oxide, and hafnium oxide.

In example embodiments, the gate structure includes a charge trap gate structure.

In example embodiments, the charge trap gate structure may include an ONO layer in each of the plurality of grooves and on each of the plurality of isolation regions, and a control gate on the ONO layer.

In example embodiments, the ONO layer may include a first oxide layer in each of the plurality of grooves and on each of the plurality of isolation regions, a nitride layer on the first oxide layer, and a second oxide layer on the nitride layer.

In example embodiments, the charge trap gate structure may include a tunnel insulating layer in each of the plurality of grooves and on each of the plurality of isolation regions, a charge storage layer on the tunnel insulating layer, a blocking insulating layer on the charge storage layer, the blocking insulating layer having a second dielectric constant which is greater than the first dielectric constant of the tunnel insulating layer, and a gate electrode on the blocking insulating layer, wherein the gate electrode includes a metal layer.

In example embodiments, the tunnel insulating layer comprises at least one of silicon oxide, silicon oxynitride, and silicon nitride.

In example embodiments, the charge storage layer comprises at least one of silicon nitride, silicon oxynitride, silicon-rich oxide, metallic oxynitride and other metallic oxide materials.

In example embodiments, the blocking insulating layer comprises a metal oxide doped with a group IV element.

In example embodiments, the blocking insulating layer comprises at least one of $HfO_2$, $Al_2O_3$, $La_2O_3$, $Hf_{1-X}Al_XO_Y$, $Hf_XSi_{1-X}O_2$, Hf—Si-oxynitride, $ZrO_2$, $Zr_XSi_{1-X}O_2$, and Zr—Si-oxynitride.

In example embodiments, the gate electrode comprises a metal layer having a work-function of at least 4 eV.

In example embodiments, the metal layer is one of titanium, titanium nitride, tantalum nitride, tantalum, tungsten, hafnium, niobium, molybdenum, ruthenium dioxide, molybdenum nitride, iridium, platinum, cobalt, chrome, ruthenium monoxide, titanium aluminide ($Ti_3Al$), $Ti_2AlN$, palladium, tungsten nitride ($WN_X$), tungsten silicide (WSi), nickel silicide, or combinations thereof.

In example embodiments, a shape of a bottom portion of each of the plurality of grooves has an obtuse or rounded profile.

In example embodiments, each groove is in a center portion of an active region.

Example embodiments are directed to a semiconductor device including a substrate including a plurality of active regions and a plurality of isolation regions between adjacent active regions, each active region including a groove, a bottom surface of the groove being below an upper surface of the active region and a gate structure formed in the plurality of grooves, wherein major axes of the active regions and major axes of the plurality of grooves are in the same direction.

In example embodiments, the plurality of grooves extend along a source, a channel, and a drain.

Example embodiments are directed to a method of manufacturing a semiconductor device including forming a plurality of active regions and a plurality of isolation regions between adjacent active regions in a substrate, forming a groove in each of the plurality of active regions, a bottom surface of the groove being below an upper surface of the active region, and forming a gate structure in each of the plurality of grooves, wherein the plurality of grooves are perpendicular to the gate structure.

In example embodiments, the plurality of grooves extend along a source, a channel, and a drain.

In example embodiments, the gate structure includes a floating gate structure.

In example embodiments, forming the plurality of active regions and the plurality of isolation regions further includes forming a mask pattern, including a pad oxide and mask nitride layer, on the substrate, etching the substrate using the mask pattern as a etching mask to form a plurality of trenches, filling the plurality of trenches with dielectric material to form the plurality of isolation regions, selectively removing the mask nitride layer to expose an upper side of the pad oxide and a portion of each isolation region.

In example embodiments, forming the groove in each of the plurality of active regions further includes forming spacers on sidewalls of each isolation region, a width of the spacer defining a width of each of the plurality of grooves and etching the exposed pad oxide and the substrate using the spacers and the isolation regions as a etching mask to form the plurality of grooves.

In example embodiments, forming the gate structure in each of the plurality of grooves further includes forming a tunneling insulation layer in each of the plurality of grooves, filling each of the plurality of grooves to form a floating gate layer, etching the spacers and an upper portion of the isolation regions and leaving a portion of the spacer on the pad oxide, forming a blocking insulation layer on the floating gate layer, forming a control gate layer on the blocking insulation layer, patterning the control gate layer to form the gate structure, and implanting ions using the gate structure as an implanting mask to form impurity regions on the active regions.

In example embodiments, the gate structure is a charge trap gate structure.

In example embodiments, forming the plurality of active regions and the plurality of isolation regions further includes forming a mask pattern, including a pad oxide and mask nitride layer, on the substrate, etching the substrate using the mask patterns as a etching mask to form a plurality of trenches, filling the plurality of trenches with dielectric material to form the plurality of isolation regions, and selectively removing the mask nitride layer to expose an upper side of the pad oxide and a portion of each isolation region.

In example embodiments, forming the groove in each of the plurality of active regions further includes forming spacers on both sidewall of each isolation region, a width of the spacer defining a width of each of the plurality of grooves and etching the exposed pad oxide and the substrate using the spacers and the isolation regions as a etching mask to form the plurality of grooves.

In example embodiments, forming the gate structure in each of the plurality of grooves further includes forming an ONO layer in each of the plurality of grooves and on each of the plurality of isolation regions and forming a control gate on the ONO layer.

In example embodiments, forming the ONO layer includes forming a first oxide layer in each of the plurality of grooves and on each of the plurality of isolation regions, forming a nitride layer on the first oxide layer, and forming a second oxide layer on the nitride layer.

In example embodiments, the charge trap gate structure may include a tunnel insulating layer in each of the plurality of grooves and on each of the plurality of isolation regions, a charge storage layer on the tunnel insulating layer, a blocking insulating layer on the charge storage layer, the blocking insulating layer having a second dielectric constant which is greater than the first dielectric constant of the tunnel insulating layer, and a gate electrode on the blocking insulating layer, wherein the gate electrode includes a metal layer.

In example embodiments, the tunnel insulating layer comprises at least one of silicon oxide, silicon oxynitride, and silicon nitride.

In example embodiments, the charge storage layer comprises at least one of silicon nitride, silicon oxynitride, silicon-rich oxide, metallic oxynitride and other metallic oxide materials.

In example embodiments, the blocking insulating layer comprises a metal oxide doped with a group IV element.

In example embodiments, the blocking insulating layer comprises at least one of $HfO_2$, $Al_2O_3$, $La_2O_3$, $Hf_{1-X}Al_XO_Y$, $Hf_XSi_{1-X}O_2$, Hf—Si-oxynitride, $ZrO_2$, $Zr_XSi_{1-X}O_2$, and Zr—Si-oxynitride.

In example embodiments, the gate electrode comprises a metal layer having a work-function of at least 4 eV.

In example embodiments, the metal layer is one of titanium, titanium nitride, tantalum nitride, tantalum, tungsten, hafnium, niobium, molybdenum, ruthenium dioxide, molybdenum nitride, iridium, platinum, cobalt, chrome, ruthenium monoxide, titanium aluminide ($Ti_3Al$), $Ti_2AlN$, palladium, tungsten nitride ($WN_x$), tungsten silicide (WSi), nickel silicide, or combinations thereof.

In example embodiments, a shape of a bottom portion of each of the plurality of grooves has an obtuse or rounded profile.

In example embodiments, each groove is in a center portion of an active region.

Example embodiments are directed to a method of manufacturing a semiconductor device including forming a plurality of active regions and a plurality of isolation regions between adjacent active regions in a substrate, forming a groove in each of the plurality of active regions, a bottom surface of the groove being below an upper surface of the active region, and forming a gate structure in each of the plurality of grooves, wherein the plurality of grooves are perpendicular to the gate structure, wherein major axes of the active regions and major axes of the plurality of grooves are in the same direction.

In example embodiments, the plurality of grooves extend along a source, a channel, and a drain.

Example embodiments are directed to a method of manufacturing a semiconductor device including forming a mask pattern, including a pad oxide and mask nitride layer, on a substrate, etching the substrate using the mask pattern as a etching mask to form a plurality of trenches and a plurality of active regions therebetween, filling the plurality of trenches with dielectric material to form a plurality of isolation regions, selectively removing the mask nitride layer to expose an upper side of the pad oxide and a portion of each isolation region, forming spacers on sidewalls of each isolation region, a width of the spacer defining a width of each of a plurality of grooves, etching the exposed pad oxide and the substrate using the spacers and the isolation regions as a etching mask to form the plurality of grooves, forming a tunneling insulation layer in each of the plurality of grooves, filling each of the plurality of grooves to form a floating gate layer, etching the spacers and an upper portion of the isolation regions and leaving a portion of the spacer on the pad oxide, forming a blocking insulation layer on the floating gate layer, forming a control gate layer on the blocking insulation layer, patterning the control gate layer to form the gate structures, and implanting ions using the gate structure as an implanting mask to form impurity regions on the active regions.

BRIEF DESCRIPTION OF THE DRAWINGS

The above and other features and advantages of example embodiments will become more apparent by describing them in detailed with reference to the accompanying drawings.

DETAILED DESCRIPTION

Figure 1:
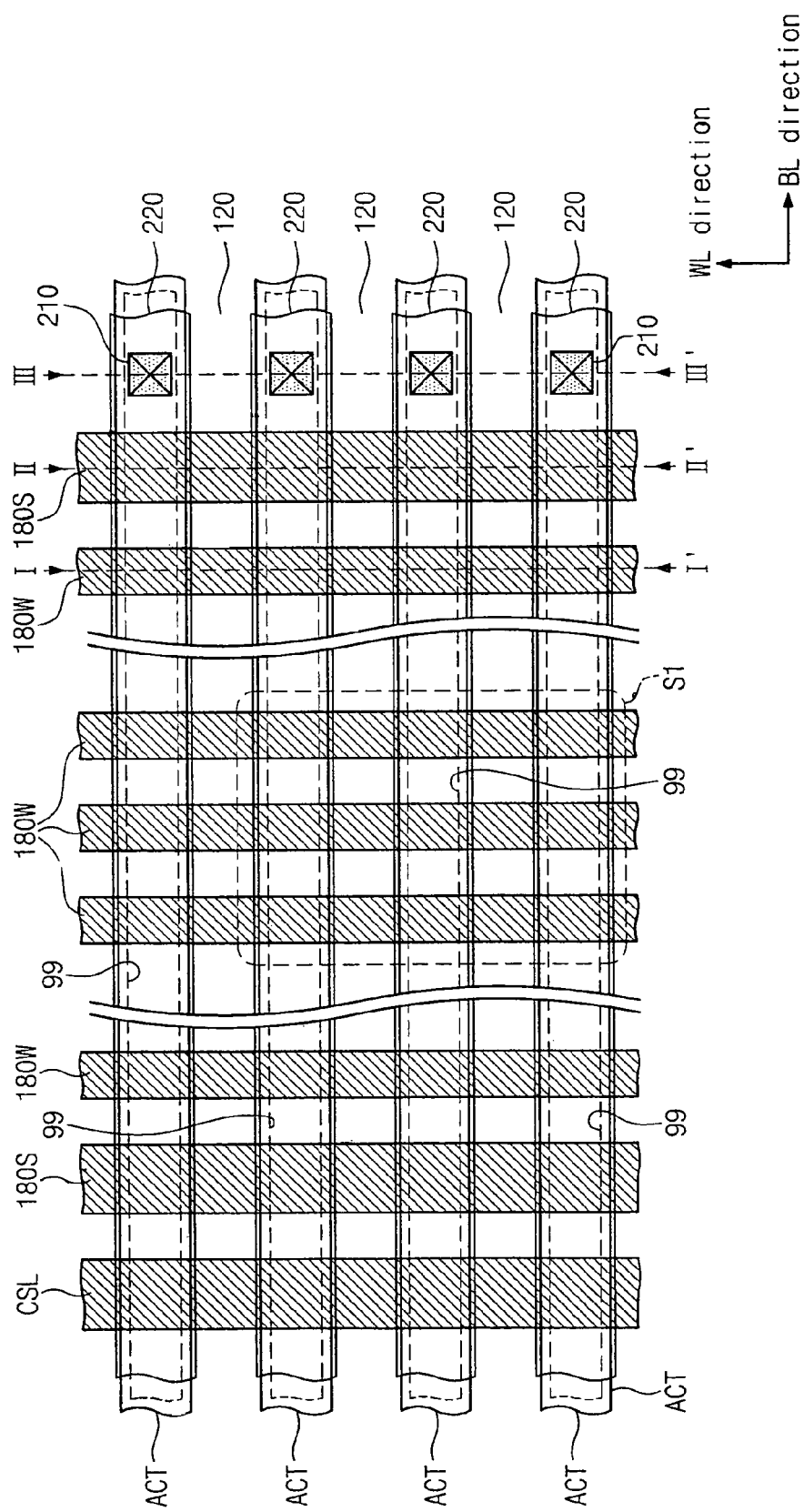
FIG. 1 illustrates a plan view of NAND flash memory cells in accordance with example embodiments.

Detailed example embodiments are disclosed herein. However, specific structural and/or functional details disclosed herein are merely representative for purposes of describing example embodiments. The claims may, however, may be embodied in many alternate forms and should not be construed as limited to only example embodiments set forth herein.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and/or scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout. Example embodiments should not be construed as limited to the particular shapes of regions illustrated in these figures but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the claims.

FIG. 1 illustrates a plan view of NAND flash memory cells in accordance with example embodiments. As shown, NAND flash memory cells may include grooves 99, isolation regions 120, select gates 180S, word lines (or gate patterns) 180W, bit line contacts 210, bit lines 220, a common source line CSL, and/or active regions ACT.

Figure 2:
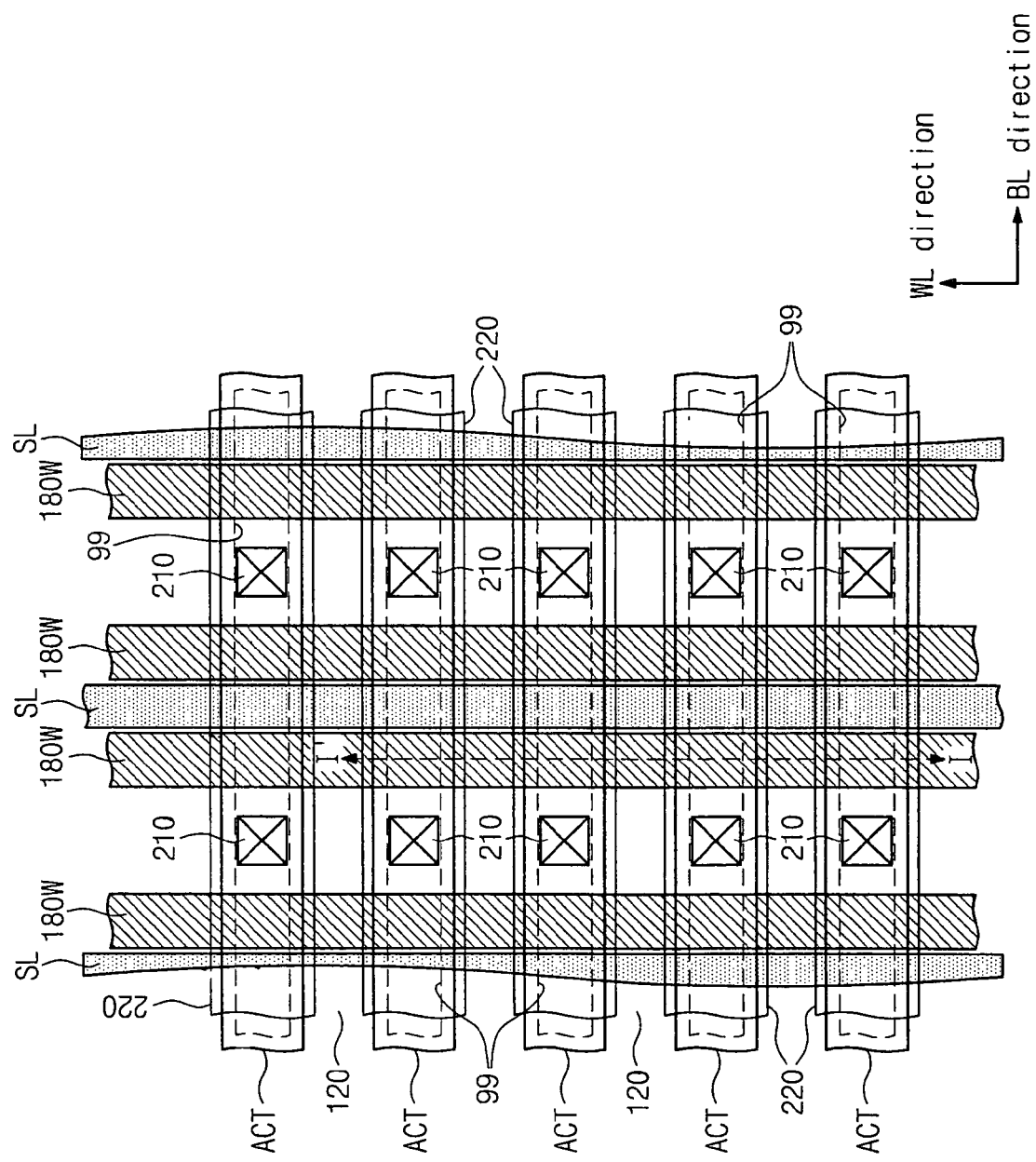
FIG. 2 illustrates a plan view of NOR flash memory cells in accordance with example embodiments.

FIG. 2 illustrates a plan view of NOR flash memory cells in accordance with example embodiments. As shown, NOR flash memory cells may also include grooves 99, isolation regions 120, source lines SL, word lines (or gate patterns) 180W, bit line contacts 210, bit lines 220, and/or active regions ACT.

Figure 3A:
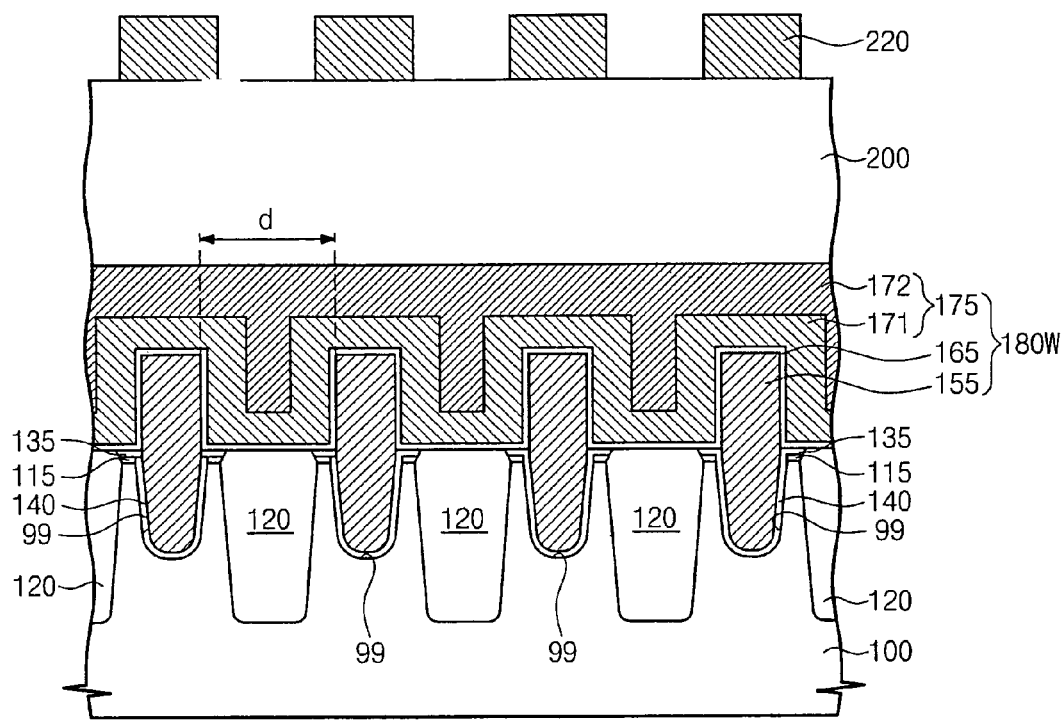
FIG. 3a illustrates a cross-sectional view at line I-I' of FIG. 1.

FIG. 3a illustrates a cross-sectional view at line I-I' of FIG. 1. The floating type NAND flash memory cells of FIG. 3a may include grooves 99, a substrate 100, isolation regions 120, word lines (or gate patterns) 180W, spacer patterns 135, and/or tunneling insulation layers 140. In example embodiments, each groove 99 is in a center portion of the corresponding active region.

Each word line (or gate pattern) 180W may further include a floating gate 155, a blocking insulation layer 165, and/or a control gate 175. Each control gate 175 may further include a lower control gate 171 and/or upper control gate 172.

In example embodiments, a bottom of the groove 99 may be lower than an upper face of an active region ACT. In example embodiments, the groove 99 may be formed along an active region ACT. In example embodiments, a channel width of the transistor is proportional of a depth of the groove 99.

In example embodiments, an active region ACT may include a source, a drain and a channel disposed between the source and drain. The gate patterns 180W may include floating gate 155, blocking insulation layer 165, and/or control gate 175. The groove 99 may be filled with gate patterns 180W.

In example embodiments, the tunneling insulation layer 140 may be between the active regions ACT and gate patterns 180W. The tunneling insulation layer 140 may be selected from silicon oxide, silicon nitride and high-k dielectric material, for example, aluminum oxide, hafnium oxide, etc.

In example embodiments, the spacer patterns 135 may remain on the pad oxide 115. In other words, the spacer patterns 135 may be disposed between the active regions ACT and gate patterns 180W. The pad oxide 115 and the spacer patterns 135 may be silicon oxide.

In example embodiments, the width of the channel is no longer the linear distance between adjacent isolation regions 120 or the linear width of each active region ACT. Because the width of the channel is increased by virtue of the depth of the groove, the width of the channel may be increased and the 'narrow width effect' may be reduced or minimized.

Figure 3B:
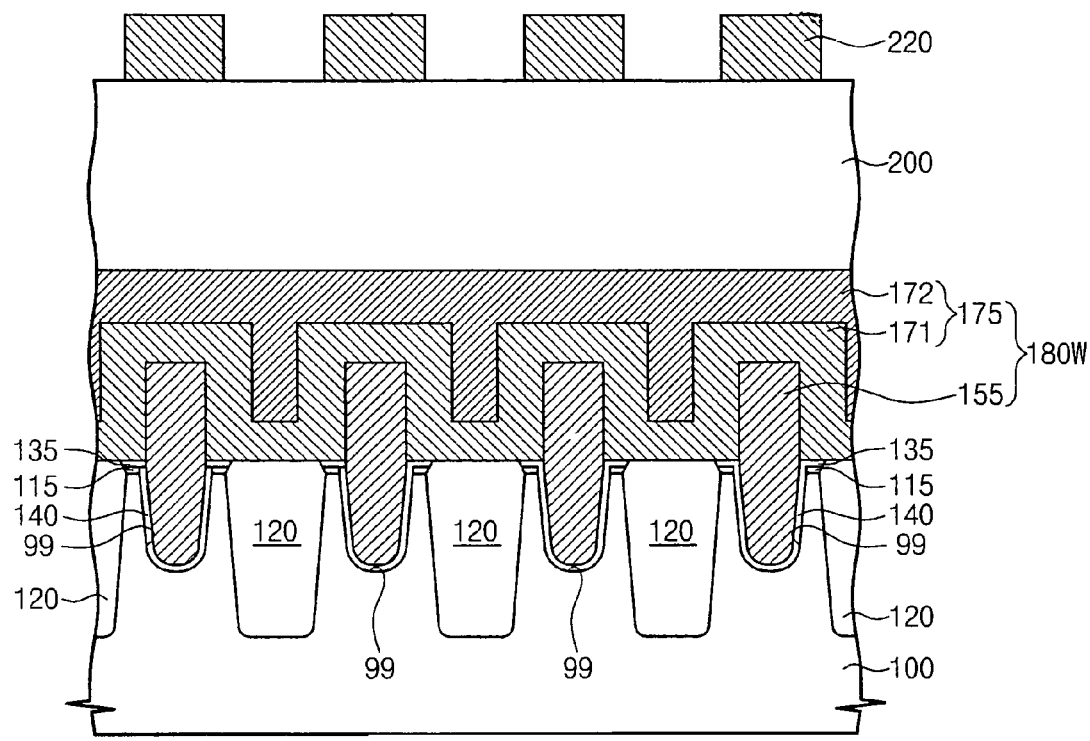
FIG. 3b illustrates a cross-sectional view at line II-II' of FIG. 1.

FIG. 3b illustrates a cross-sectional view at line II-II' of FIG. 1. FIG. 3b is almost identical to FIG. 3a, except that line II-II' of FIG. 3b cuts through the select gate 180S of FIG. 1, instead of a gate pattern 180W.

Figure 3C:
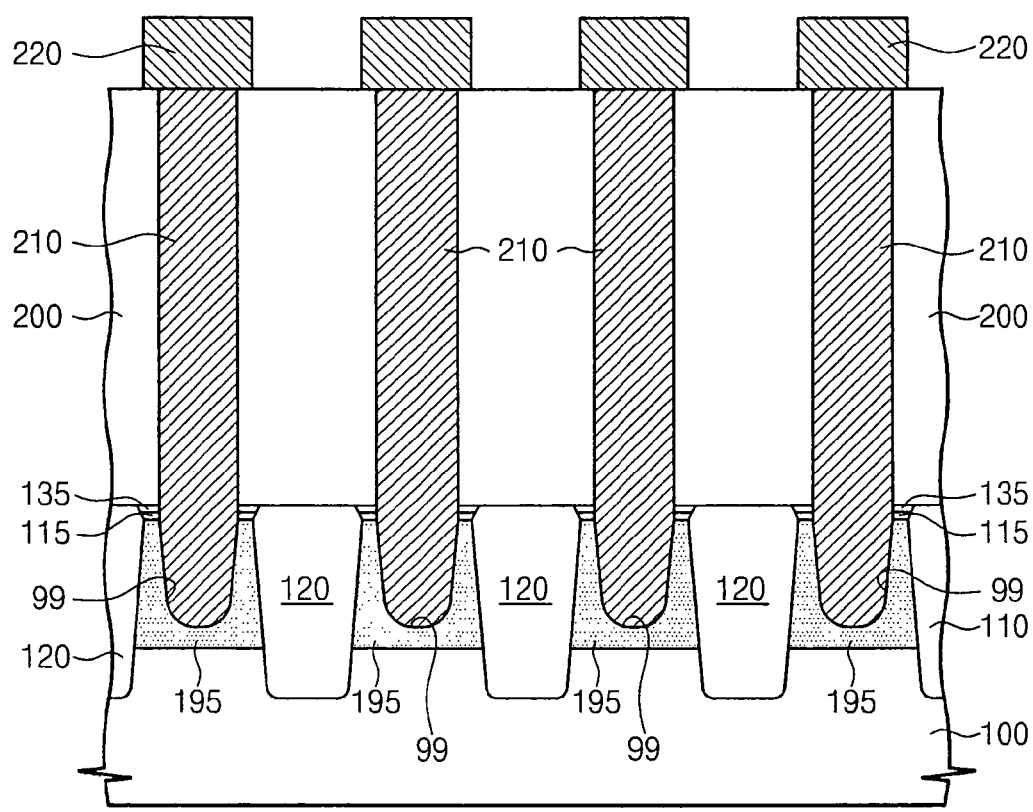
FIG. 3c illustrates a cross-sectional view at line of FIG. 1.

FIG. 3c illustrates a cross-sectional view at line of FIG. 1. FIG. 3c illustrates the bit line contacts 210, in more detail.

Figure 4A:
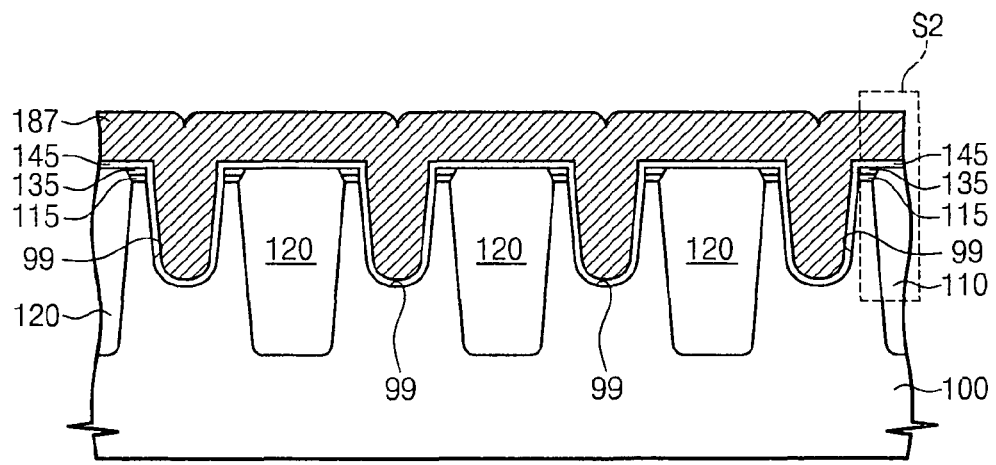
FIG. 4a illustrates a cross-sectional view of a charge trap type NAND flash memory cells in accordance with example embodiments.

FIG. 4a illustrates a cross-sectional view of charge trap type NAND flash memory cells in accordance with example embodiments. As shown, gate patterns may include an oxide-nitride-oxide (ONO) layer 145 and control gate 187.

Figure 4B:
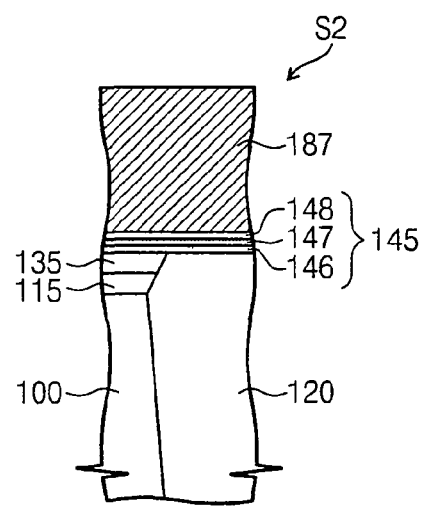
FIG. 4b illustrates a magnified view of area S2 of FIG. 4a in accordance with example embodiments.

FIG. 4b illustrates a magnified view of area S2 of FIG. 4a in accordance with example embodiments. As shown, the ONO layer 145 may include lower gate insulation layer 146, charge trap layer 147, and upper gate insulation layer 148. The charge trap layer 147 may be made of SiN.

As described above, in example embodiments, a channel region may be recessed with respect to the active regions. In example embodiments, a bottom surface of the groove 99 may be below an upper surface of an active region, as shown, for example, in FIG. 3a. The bottom surface of the groove 99 may be defined as the lowest point of the groove 99, for example, the obtuse or rounded portion, as show in FIG. 3a. The upper surface of the active region may be defined as an upper surface of any of the substrate 100, the pad oxide 115, or the spacer pattern 135.

Figure 4C:
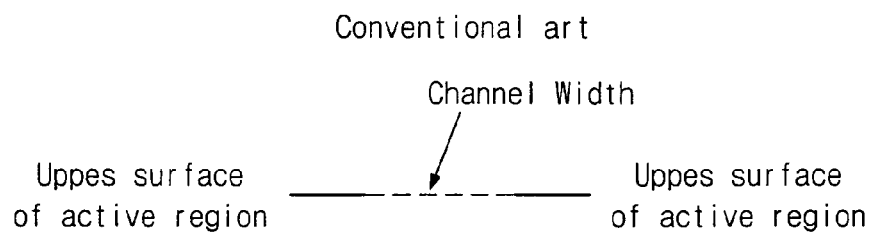
FIG. 4c illustrates the relationship between an upper surface of an active region and the channel width in the conventional art.
Figure 4D:
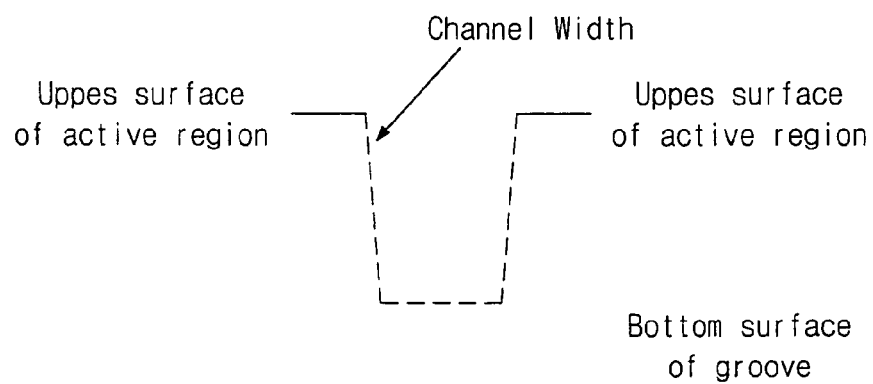
FIG. 4d illustrates the relationship between an upper surface of an active region, a bottom surface of the groove, and the channel width in example embodiments.
Figure 4E:
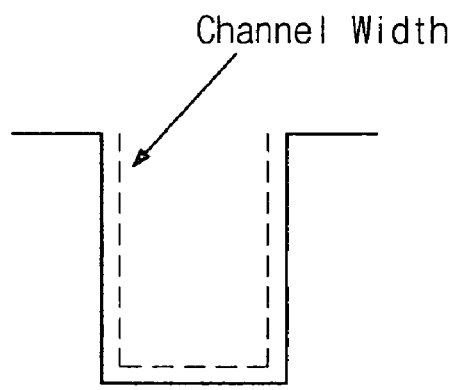
FIG. 4e illustrates a flat bottom groove profile in accordance with example embodiments.
Figure 4F:
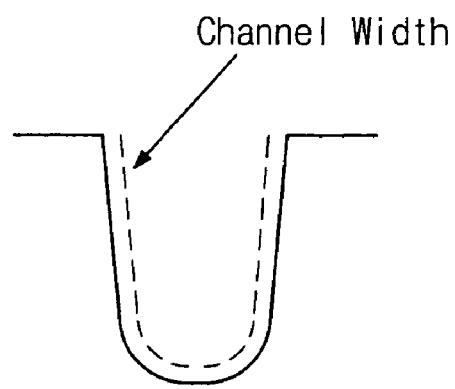
FIG. 4f illustrates an obtuse or rounded bottom groove profile in accordance with example embodiments.

FIG. 4c illustrates the relationship between an upper surface of an active region and the channel width in the conventional art. FIG. 4d illustrates the relationship between an upper surface of an active region, a bottom surface of the groove, and the channel width in example embodiments. As shown, even if upper surfaces of two active regions are very close together, the channel width therebetween may be maintained by controlling the depth of the groove. In this manner, problems relating to the narrow width effect and reduced drain current may be reduced or minimized. FIGS. 4e and 4f illustrate example groove profiles, where FIG. 4e illustrates a flat bottom groove profile and FIG. 4f illustrates an obtuse or rounded bottom groove profile. In example embodiments, the groove may have any depth (or height) and/or any profile that increases the channel width, as shown in FIG. 4d.

Figure 5A:
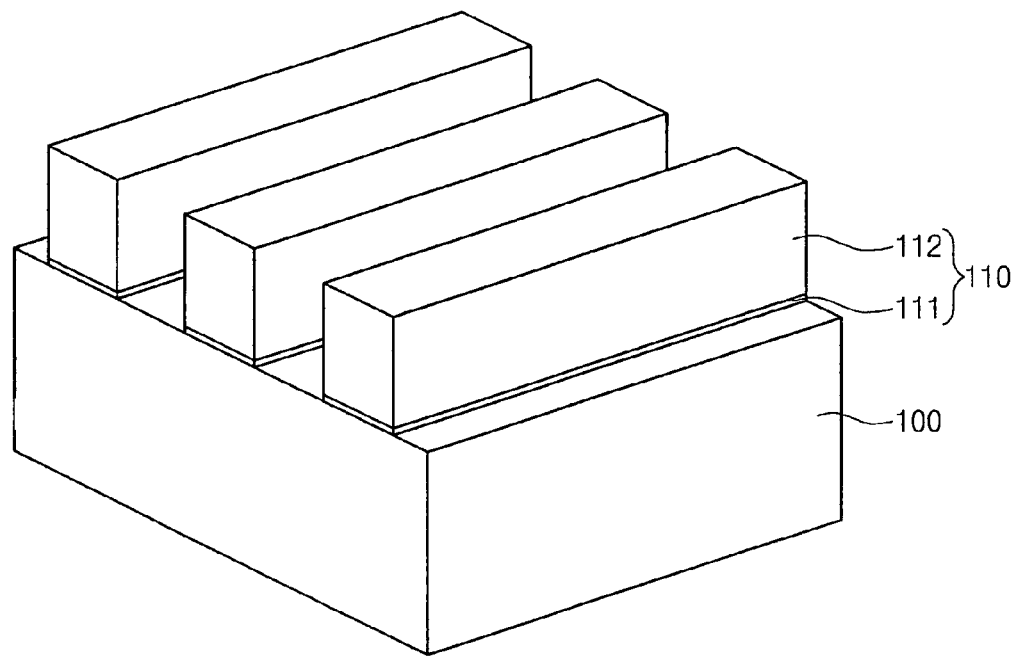
FIGS. 5a-5m illustrate a process for manufacturing memory cells in accordance with example embodiments.

FIGS. 5a-5m illustrate a process for manufacturing memory cells in accordance with example embodiments. As shown in FIG. 5a, mask patterns 110 may be formed on a semiconductor substrate 100. The mask patterns 110 may include a pad oxide 111 and/or a mask nitride layer 112.

Figure 5B:
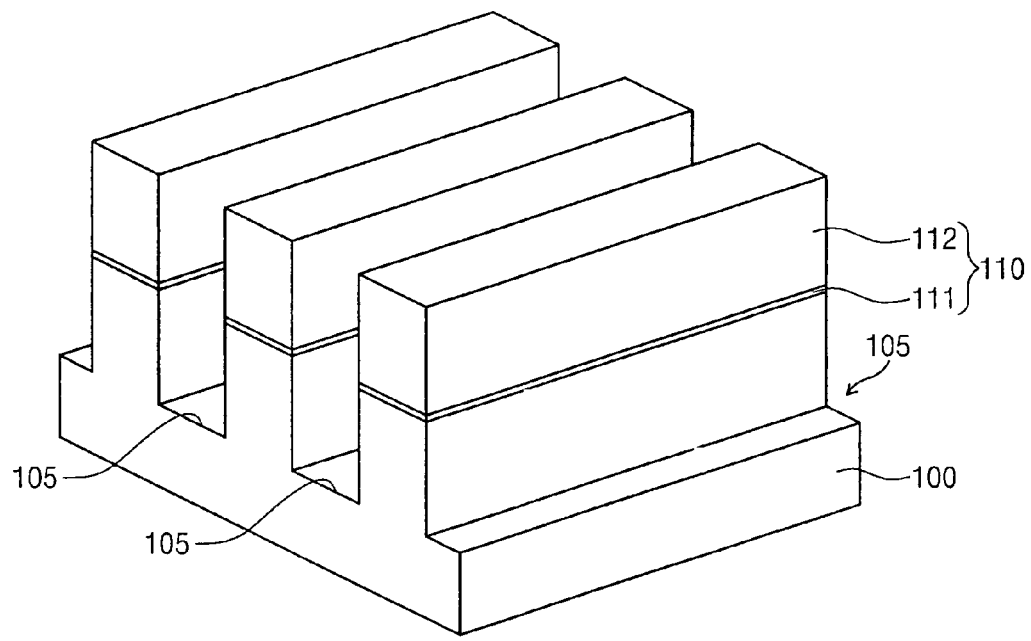

As shown in FIG. 5b, the substrate 100 may be etched using the mask patterns 110 as an etching mask to form trenches 105.

Figure 5C:
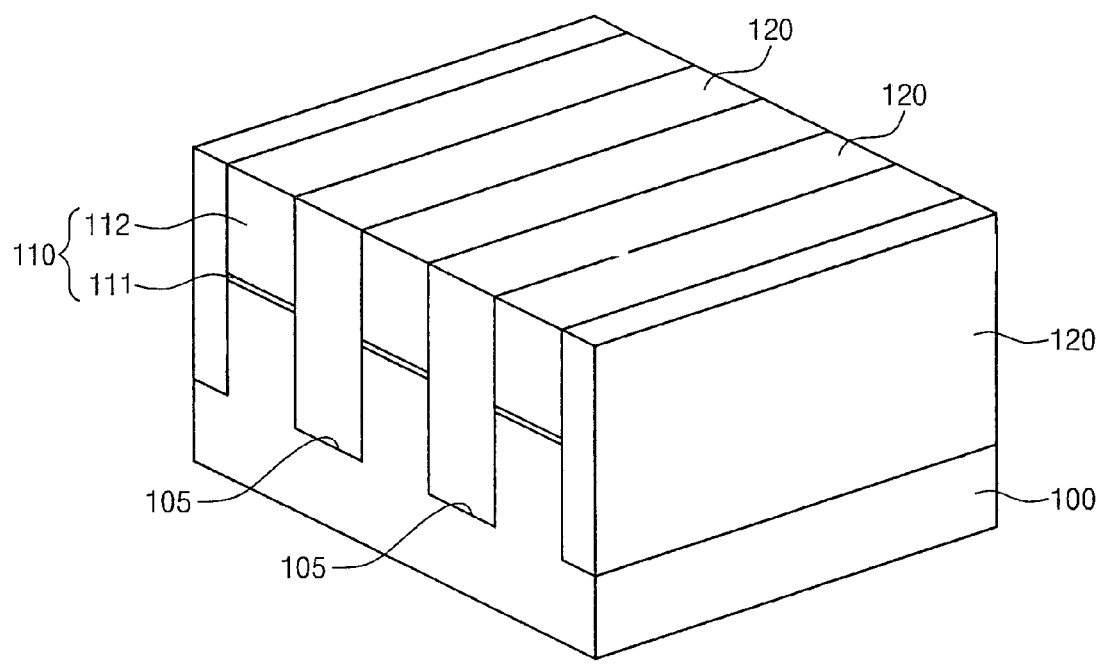

As shown in FIG. 5c, the trenches 105 may be filled with dielectric material to form isolation regions 120. The dielectric material may be silicon oxide.

Figure 5D:
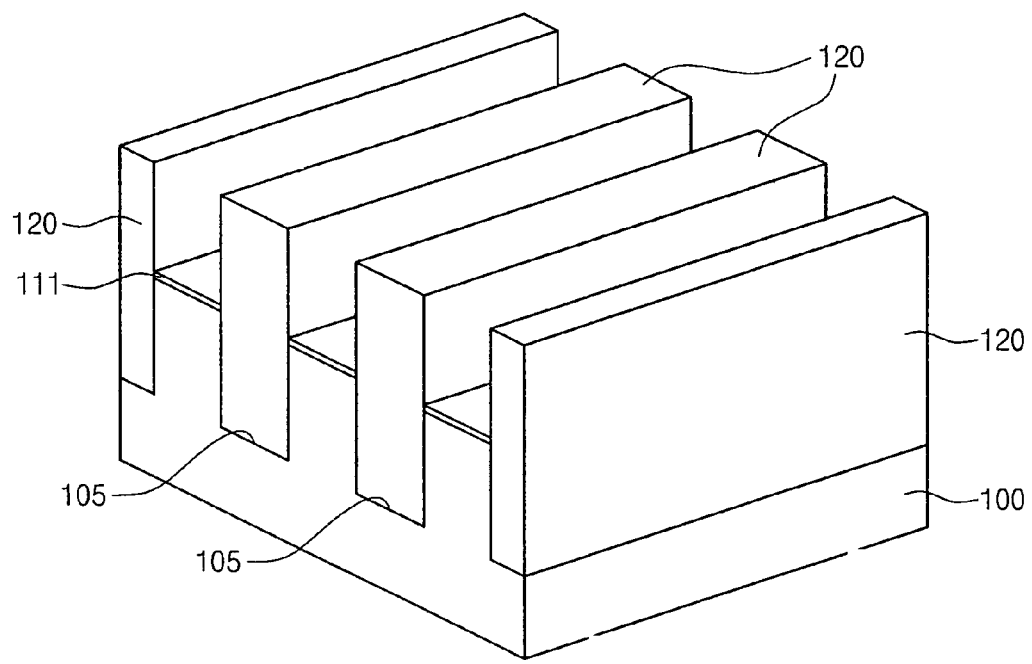

As shown in FIG. 5d, the mask nitride 112 may be selectively removed to expose an upper side of the pad oxide 111 and a portion, for example, upper side walls, of the isolation regions 120.

Figure 5E:
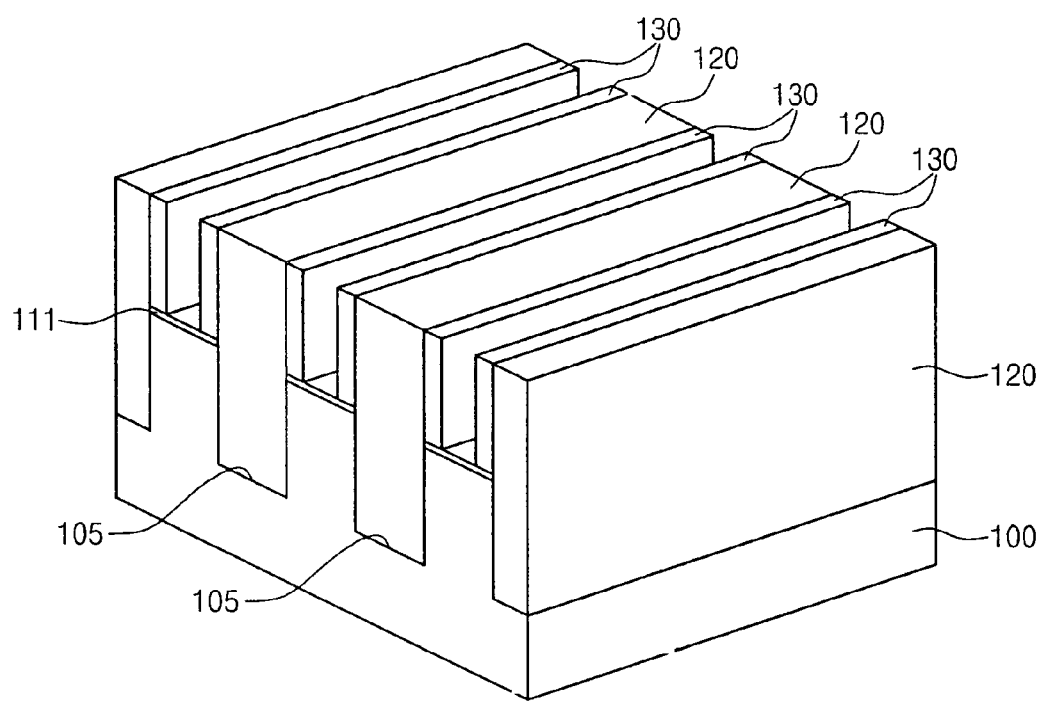

As shown in FIG. 5e, spacers 130 may be formed on sidewalls, for example, the exposed, upper side walls of the isolation regions 120. A width of a groove 99, to be formed, may be defined by a width of the spacer 130. The spacer 130 may be made of a dielectric material. For example, the spacer

130 may be of the same material as the isolation region 120. In example embodiments, this material may be silicon oxide.

Figure 5F:
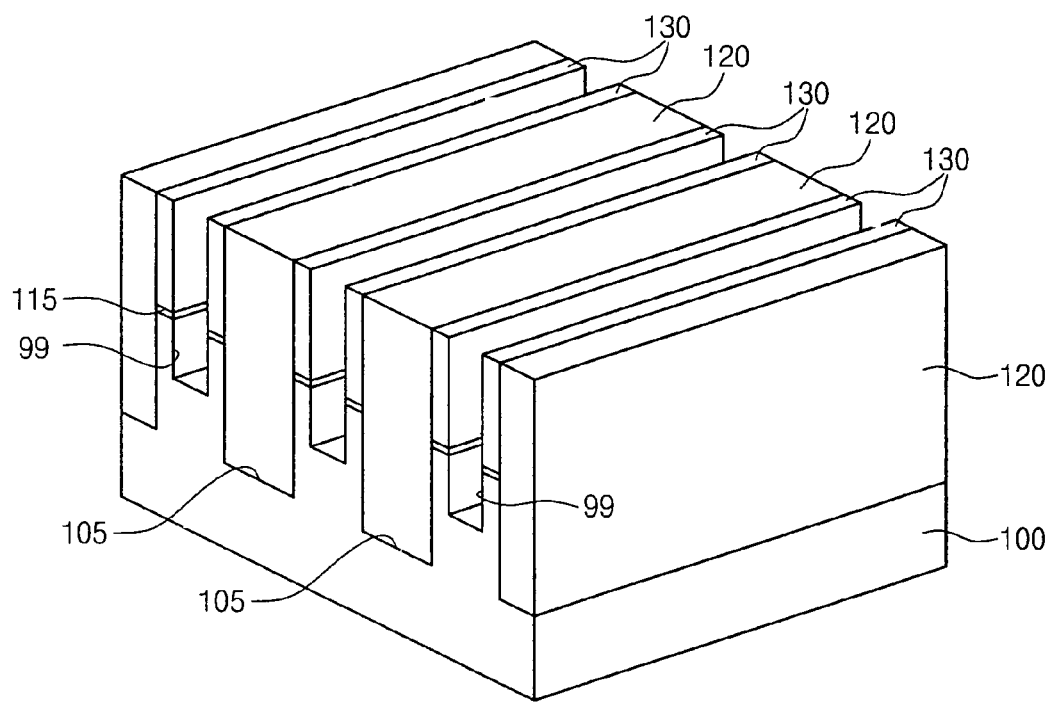

As shown in FIG. 5f, the exposed pad oxide 111 and the substrate 100 may be etched using the spacer 130 and the isolation region 120 as an etching mask to form the grooves 99. In example embodiments, the grooves 99 may have a flat profile. In example embodiments, the grooves 99 may have an obtuse profile or rounded profile. The obtuse profile or rounded profile may be obtained by wet etching. In example embodiments, the grooves 99 may have any profile that increases channel width.

Figure 5G:
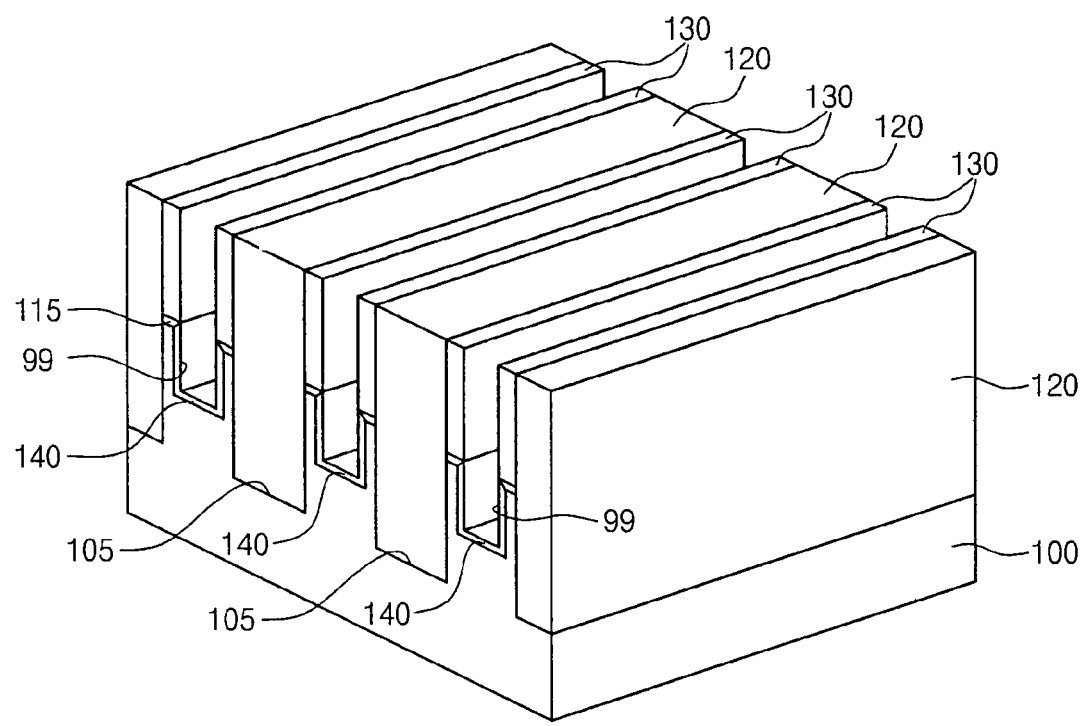

As shown in FIG. 5g, a tunneling insulation layer 140 may be formed inside the groove 99. In example embodiments, the tunneling insulation layer 140 may be selected from silicon oxide, silicon nitride and high-k dielectric material, for example, aluminum oxide, hafnium oxide, etc.

Figure 5H:
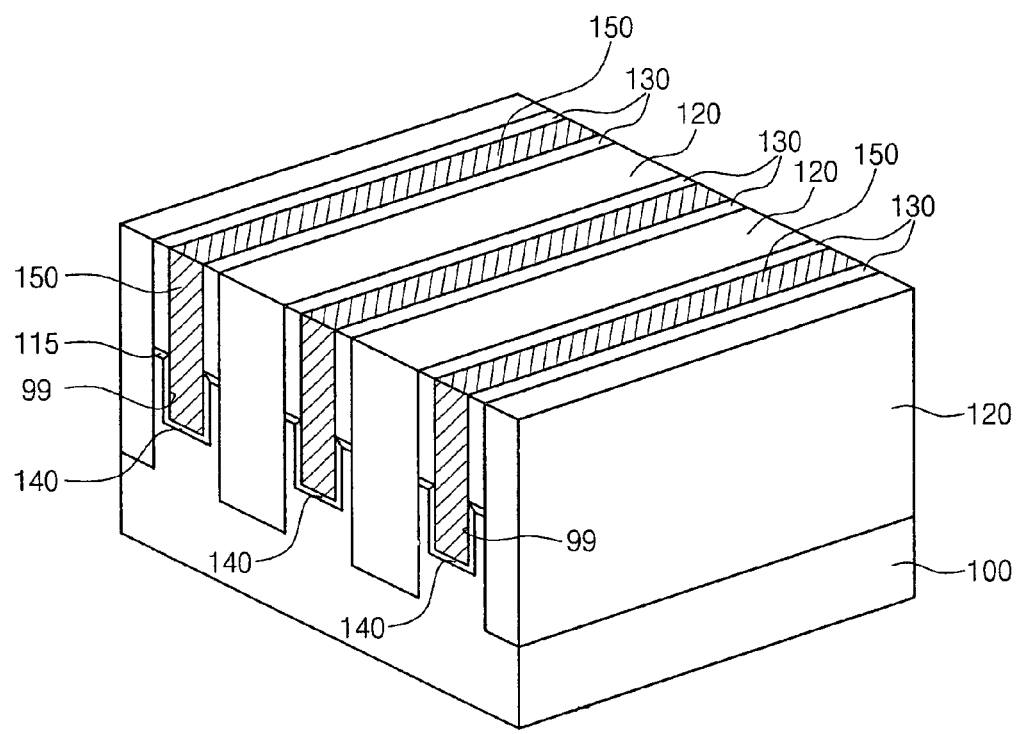
Figure 5I:
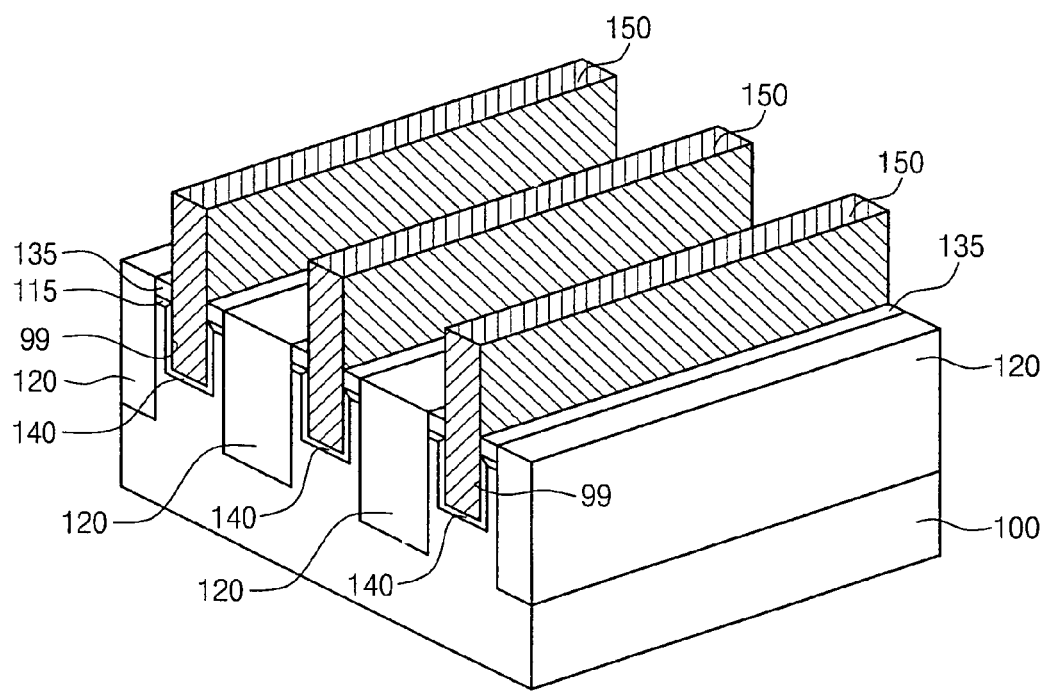
Figure 5J:
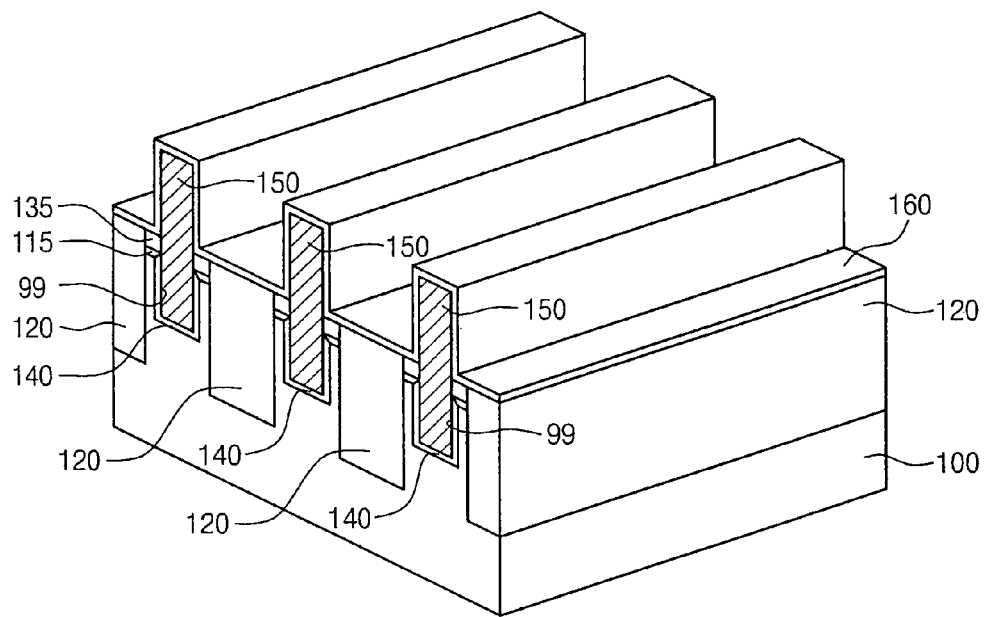

In example embodiments, a floating gate layer may be formed. FIGS. 5h-5j illustrate the formation of an example floating gate layer.

As shown in FIG. 5h, the groove 99 may be filled to form a floating gate layer 150. A chemical mechanical polishing (CMP) process may be performed to smooth the top surface of the resulting structure, as shown in FIG. 5h.

As shown in FIG. 5i, the spacer 130 and an upper portion of the isolation region 120 may be etched away. Spacer patterns 135 may remain on the pad oxide 115.

As shown in FIG. 5j, a blocking insulation layer 160 may be formed on the structure of the FIG. 5i.

In example embodiments, a charge trap layer may be formed. FIGS. 5h-5j are unnecessary for the formation of an example charge trap layer.

Figure 5K:
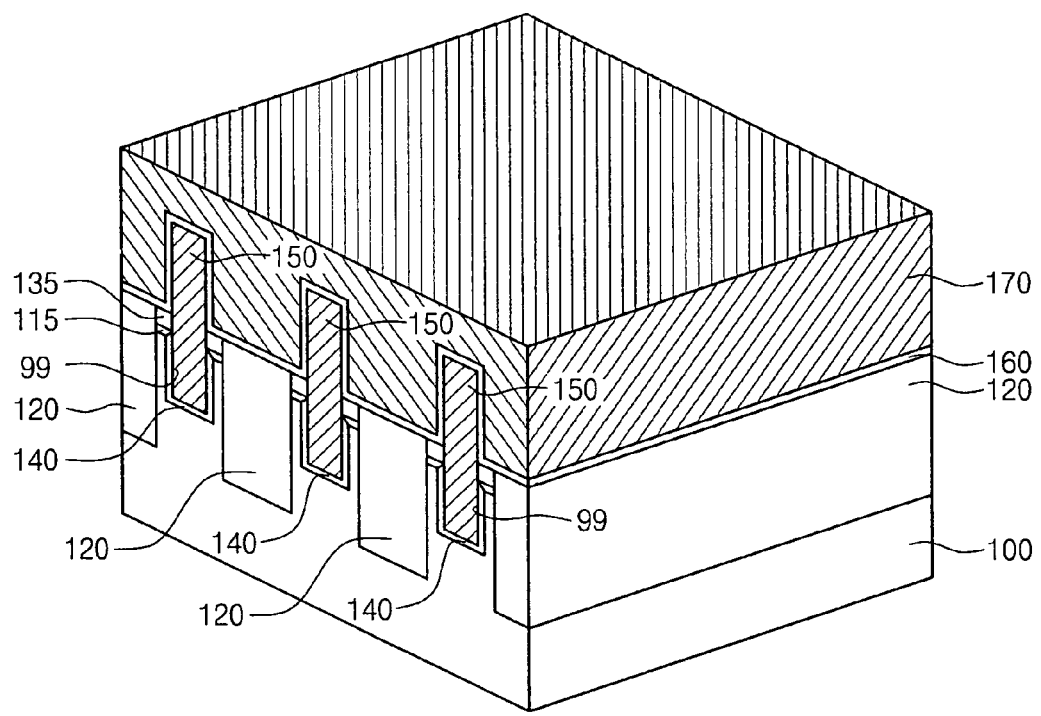

As shown in FIG. 5k, a control gate layer 170 may be formed on the structure of FIG. 5j.

Figure 5L:
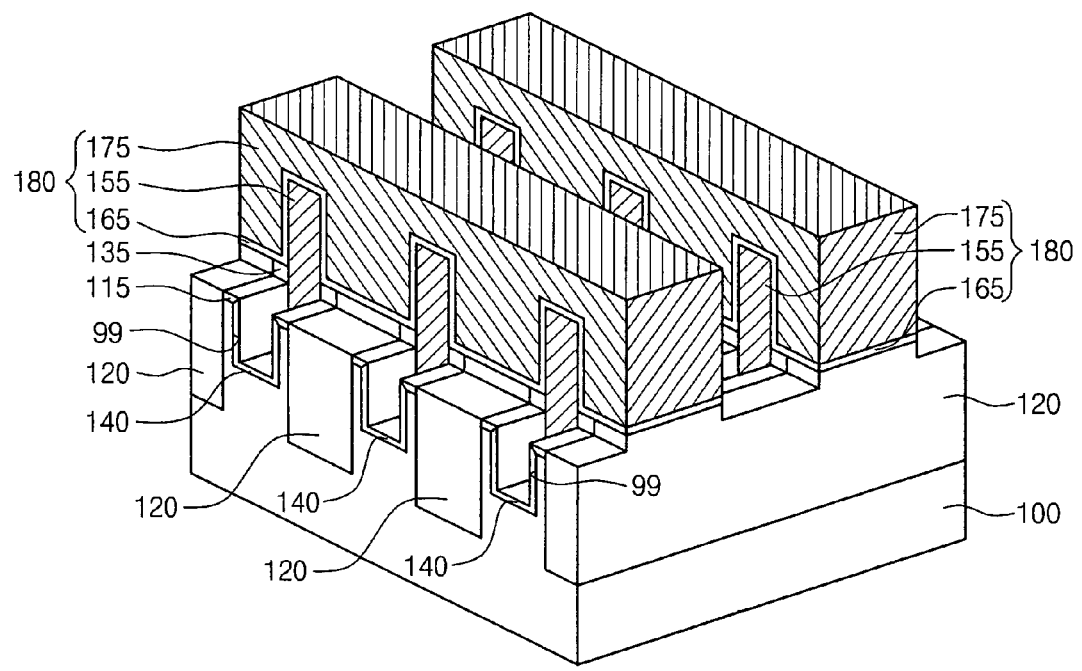

As shown in FIG. 5l, the structure of FIG. 5k may be patterned to form gate structures 180. Each gate structure 180 may be a multilayer structure. Each gate structure 180 may include a floating gate 155, a blocking insulation layer 165, and/or a control gate 175. As shown in FIG. 5l, the gate structures 180 may be perpendicular to the grooves 99. As shown in FIG. 5l, major axes of the active regions and major axes of the plurality of grooves are in the same direction.

In example embodiments, the control gate 175 may be a poly or poly to metal layer.

Figure 5M:
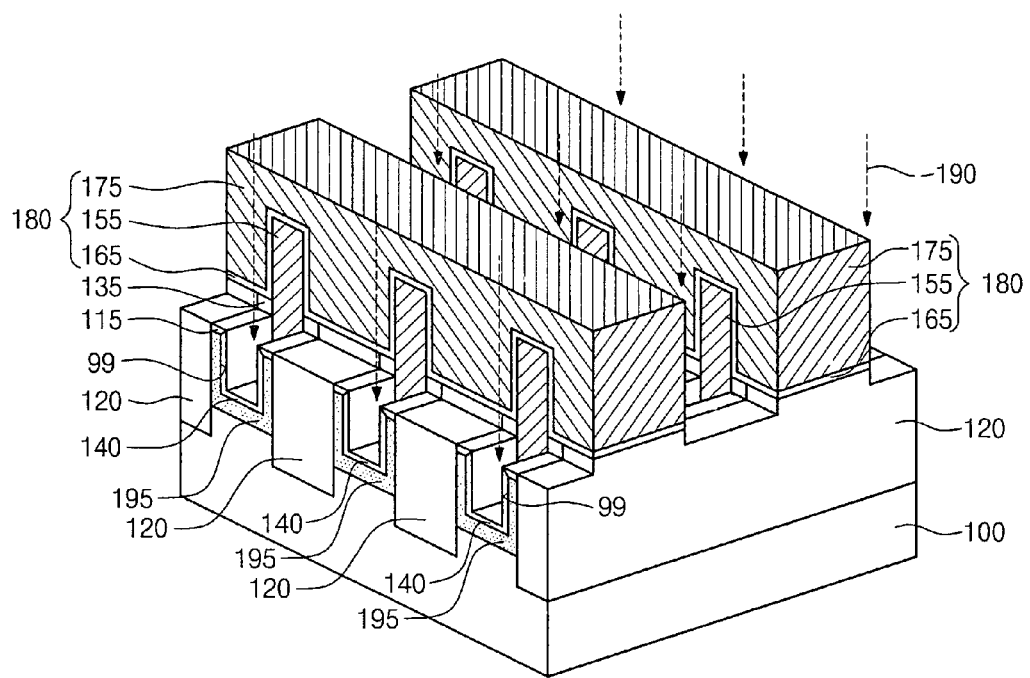

As shown in FIG. 5m, ion implantation, shown by implanting ions 190 may be performed using the gate structures 180 as an implanting mask to form impurity regions 195 on the active region (ACT) that act as the source and drain for the resulting transistor. As shown in FIG. 5m, the grooves 99 extend along the source, the channel, and the drain of the resulting transistor.

In example embodiment as described above the gate structure may be a floating gate structure, as illustrated in FIGS. 5a-5m or a charge trap gate structure, as illustrated in FIGS. 5a-5g and 5k-5m. Regarding gate structures, the contents of U.S. Patent Application No. 2006/0180851, filed on Apr. 12, 2006, are incorporated by reference herein, in their entirety.

In example embodiments, the charge trap gate structure may be an ONO structure. In example embodiments, the ONO structure may include a first oxide layer in one or more of the plurality of grooves 99 and on one or more of the plurality of isolation regions 120, a nitride layer on the first oxide layer, and a second oxide layer on the nitride layer.

In other example embodiments, the charge trap gate structure may include a tunnel insulating layer in one or more of the plurality of grooves 99 and on one or more of the plurality of isolation regions 120, a charge storage layer on the tunnel insulating layer, a blocking insulating layer on the charge storage layer, the blocking insulating layer having a second dielectric constant which is greater than a first dielectric constant of the tunnel insulating layer; and a gate electrode on the blocking insulating layer, wherein the gate electrode comprises a metal layer.

The tunnel insulating layer may comprise one or more of silicon oxide, silicon oxynitride, and silicon nitride. The charge storage layer may comprise one or more of silicon nitride, silicon oxynitride, silicon-rich oxide, metallic oxynitride and other metallic oxide materials. The blocking insulating layer may comprise metallic oxide or metallic oxynitride of a group III element or group VB element in the Mendeleef Periodic Table.

According to example embodiments, the blocking insulating layer may comprise doped metal oxide or doped metal oxynitride in which metal oxide is doped with a group IV element in the Mendeleef Periodic Table. The blocking insulating layer may also comprise one of more of $HfO_2$, $Al_2O_3$, $La_2O_3$, $Hf_{1-x}Al_xO_Y$, $Hf_xSi_{1-x}O_2$, Hf—Si-oxynitride, $ZrO_2$, $Zr_xSi_{1-x}O_2$, Zr—Si-oxynitride, and combinations thereof.

The metal layer of the gate electrode may have a work-function of, for example, at least 4 eV. The metal layer may be one of titanium, titanium nitride, tantalum nitride, tantalum, tungsten, hafnium, niobium, molybdenum, ruthenium dioxide, molybdenum nitride, iridium, platinum, cobalt, chrome, ruthenium monoxide, titanium aluminide ($Ti_3Al$), $Ti_2AlN$, palladium, tungsten nitride ($WN_x$), tungsten silicide (WSi), nickel silicide, or combinations thereof.

While example embodiments have been particularly shown and described with reference to the example embodiments shown in the drawings, it will be understood by those of ordinary skill in the art that various changes in form and detail may be made therein without departing from the spirit and scope of the following claims.

What is claimed is:

1. A method of manufacturing a semiconductor device, comprising:
   forming a plurality of active regions and a plurality of isolation regions between adjacent active regions in a substrate,
   forming a groove in each of the plurality of active regions, a bottom surface of the groove being below an upper surface of the active region; and
   forming a gate structure in each of the plurality of grooves, wherein the plurality of grooves are perpendicular to the gate structure, the gate structure includes a blocking insulation layer, and a lowest surface of the blocking insulation layer is higher than the plurality of isolation regions and extends into the gate structure.

2. The method of claim 1, wherein the plurality of grooves extend along a source, a channel, and a drain.

3. The method of claim 1, wherein the gate structure includes a floating gate structure.

4. The method of claim 3, wherein forming the plurality of active regions and the plurality of isolation regions further includes,
   forming a mask pattern, including a pad oxide and mask nitride layer, on the substrate,
   etching the substrate using the mask pattern as an etching mask to form a plurality of trenches,
   filling the plurality of trenches with dielectric material to form the plurality of isolation regions,
   selectively removing the mask nitride layer to expose an upper side of the pad oxide and a portion of each isolation region.

5. The method of claim 4, wherein forming the groove in each of the plurality of active regions further includes, forming spacers on sidewalls of each isolation region, a width of the spacer defining a width of each of the plurality of grooves, etching the exposed pad oxide and the substrate using the spacers and the isolation regions as an etching mask to form the plurality of grooves.

6. The method of claim 4, wherein forming the gate structure in each of the plurality of grooves further includes, forming a tunneling insulation layer in each of the plurality of grooves, filling each of the plurality of grooves to form a floating gate layer, etching the spacers and an upper portion of the isolation regions and leaving a portion of the spacer on the pad oxide, forming the blocking insulation layer on the floating gate layer, forming a control gate layer on the blocking insulation layer patterning the control gate layer to form the gate structure, and implanting ions using the gate structure as an implanting mask to form impurity regions on the active regions.

7. The semiconductor device of claim 1, wherein the gate structure is a charge trap gate structure.

8. The method of claim 7, wherein forming the plurality of active regions and the plurality of isolation regions further includes, forming a mask pattern, including a pad oxide and mask nitride layer, on the substrate, etching the substrate using the mask patterns as an etching mask to form a plurality of trenches, filling the plurality of trenches with dielectric material to form the plurality of isolation regions, selectively removing the mask nitride layer to expose an upper side of the pad oxide and a portion of each isolation region.

9. The method of claim 8, wherein forming the groove in each of the plurality of active regions further includes, forming spacers on both sidewall of each isolation region, a width of the spacer defining a width of each of the plurality of grooves, etching the exposed pad oxide and the substrate using the spacers and the isolation regions as an etching mask to form the plurality of grooves.

10. The method of claim 7, wherein forming the gate structure in each of the plurality of grooves further includes, forming an ONO layer in each of the plurality of grooves and on each of the plurality of isolation regions, and forming a control gate on the ONO layer.

11. The method of claim 10, wherein forming the ONO layer includes forming a first oxide layer in each of the plurality of grooves and on each of the plurality of isolation regions, forming a nitride layer on the first oxide layer, and forming a second oxide layer on the nitride layer.

12. The method of claim 10, wherein forming the gate structure in each of the plurality of grooves further includes forming a tunnel insulating layer in each of the plurality of grooves and on each of the plurality of isolation regions, forming a control gate charge storage layer on the tunnel insulating layer, forming the blocking insulating layer on the charge storage layer, the blocking insulating layer having a second dielectric constant which is greater than the first dielectric constant of the tunnel insulating layer; and forming a gate electrode on the blocking insulating layer, wherein the gate electrode includes a metal layer.

13. The method of claim 12, wherein the tunnel insulating layer comprises at least one of silicon oxide, silicon oxynitride, and silicon nitride.

14. The method of claim 12, wherein the charge storage layer comprises at least one of silicon nitride, silicon oxynitride, silicon-rich oxide, metallic oxynitride and other metallic oxide materials.

15. The method of claim 12, wherein the blocking insulating layer comprises a metal oxide doped with a group IV element.

16. The method of claim 12, wherein the blocking insulating layer comprises at least one of $HfO_2$, $Al_2O_3$, $La_2O_3$, $Hf_{1-x}Al_xO_y$, $Hf_xSi_{1-x}O_2$, Hf—Si-oxynitride, $ZrO_2$, $Zr_xSi_{1-x}O_2$, and Zr—Si-oxynitride.

17. The method of claim 12, wherein the gate electrode comprises a metal layer having a work-function of at least 4 eV.

18. The method of claim 12, wherein metal layer is one of titanium, titanium nitride, tantalum nitride, tantalum, tungsten, hafnium, niobium, molybdenum, ruthenium dioxide, molybdenum nitride, iridium, platinum, cobalt, chrome, ruthenium monoxide, titanium aluminide ($Ti_3Al$), $Ti_2AlN$, palladium, tungsten nitride ($WN_x$), tungsten silicide (WSi), nickel silicide, or combinations thereof.

19. The method of claim 1, wherein a shape of a bottom portion of each of the plurality of grooves has an obtuse or rounded profile.

20. The method device of claim 1, wherein each groove is in a center portion of the active region.

21. A method of manufacturing a semiconductor device, comprising:

forming a plurality of active regions and a plurality of isolation regions between adjacent active regions in a substrate, forming a groove in each of the plurality of active regions, a bottom surface of the groove being below an upper surface of the active region; and forming a gate structure in each of the plurality of grooves, wherein the plurality of grooves are perpendicular to the gate structure, major axes of the active regions and major axes of the plurality of grooves are in the same direction; the gate structure includes a blocking insulation layer, and a lowest surface of the blocking insulation layer is higher the plurality of isolation regions and extends into the gate structure.

22. The method of claim 21, wherein the plurality of grooves extend along a source, a channel, and a drain.

23. A method of manufacturing a semiconductor device, comprising:

forming a mask pattern, including a pad oxide and mask nitride layer, on a substrate;

etching the substrate using the mask pattern as an etching mask to form a plurality of trenches and a plurality of active regions therebetween;

filling the plurality of trenches with dielectric material to form a plurality of isolation regions;

selectively removing the mask nitride layer to expose an upper side of the pad oxide and a portion of each isolation region;

forming spacers on sidewalls of each isolation region, a width of the spacer defining a width of each of a plurality of grooves, etching the exposed pad oxide and the substrate using the spacers and the isolation regions as an etching mask to form the plurality of grooves;

forming a tunneling insulation layer in each of the plurality of grooves;

filling each of the plurality of grooves to form a floating gate layer;

etching the spacers and an upper portion of the isolation regions and leaving a portion of the spacer on the pad oxide;

forming a blocking insulation layer on the floating gate layer;

forming a control gate layer on the blocking insulation layer;

patterning the control gate layer to form the gate structures; and implanting ions using the gate structure as an implanting mask to form impurity regions on the active regions.

* * * * *